(12) United States Patent
Sheng (10) Patent No.: US 10,325,005 B2
(45) Date of Patent: Jun. 18, 2019

(54) APPARATUSES AND METHODS FOR CALIBRATING MAGNETOMETER ATTITUDE-INDEPENDENT PARAMETERS

(75) Inventor: Hua Sheng, Clarksburg, MD (US)

(73) Assignee: IDHL Holdings, Inc., Wilmington, DE (US)

( * ) Notice: Subject to any disclaimer, the term of this patent is extended or adjusted under 35 U.S.C. 154(b) by 1041 days.

(21) Appl. No.: 13/885,248

(22) PCT Filed: Nov. 17, 2011

(86) PCT No.: PCT/US2011/061168
§ 371 (c)(1),
(2), (4) Date: May 14, 2013

(87) PCT Pub. No.: WO2012/068362
PCT Pub. Date: May 24, 2012

(65) Prior Publication Data
US 2013/0238268 A1 Sep. 12, 2013

Related U.S. Application Data (60) Provisional application No. 61/414,570, filed on Nov. 17, 2010.

(51) Int. Cl.
*G01B 7/00* (2006.01)
*G01R 33/00* (2006.01)
*G06F 17/16* (2006.01)
*G01R 33/022* (2006.01)

(52) U.S. Cl.
CPC ............ *G06F 17/16* (2013.01); *G01B 7/003* (2013.01); *G01R 33/0035* (2013.01); *G01R 33/022* (2013.01)

(58) Field of Classification Search
CPC ... G01R 33/0035; G01R 33/022; G06F 17/16; G01B 7/003
See application file for complete search history.

(56) References Cited

U.S. PATENT DOCUMENTS

| | | | |
|---|---|---|---|
| 6,577,976 B1 * | 6/2003 | Hoff | G01C 17/38 324/246 |
| 6,765,383 B1 | 7/2004 | Barringer | |

(Continued)

OTHER PUBLICATIONS

Gebre-Egziabher, "Magnetometer Autocalibration Leveraging Measurement Locus Constraints", 2007, Journal of Aircraft, vol. 44, No. 4, Jul.-Aug. 2007.*

(Continued)

*Primary Examiner* — Regis J Betsch
(74) *Attorney, Agent, or Firm* — Theodore Naccarella (57) ABSTRACT

Methods and apparatuses for calibrating attitude-independent parameters of a 3-D magnetometer are provided. A calibration method includes storing and updating data related to a N×9 matrix T and a N×1 matrix U extended for each measurement with an additional row and an additional element, respectively, the additional row and the additional element being calculated based on values measured by the 3-D magnetometer for the respective measurement. The method further includes calculating analytically (1) a symmetric non-orthogonal 3×3 matrix D representing scaling and skew of the 3-D magnetometer measured values and (2) a vector b representing bias of the 3-D magnetometer measured values, using the stored data and a singular value decomposition (SVD) method.

18 Claims, 4 Drawing Sheets

(56) References Cited

U.S. PATENT DOCUMENTS

| | | | | |
|---|---|---|---|---|
| 7,451,549 B1* | 11/2008 | Sodhi | ............... | G01C 17/38 33/356 |
| 7,930,148 B1* | 4/2011 | Figaro | ............... | E21B 47/022 33/312 |
| 2002/0100178 A1* | 8/2002 | Smith | ............... | G01C 17/38 33/356 |
| 2004/0123474 A1 | 7/2004 | Manfred et al. | | |
| 2006/0066295 A1* | 3/2006 | Tamura | ............... | G01C 17/38 324/202 |
| 2008/0222675 A1 | 9/2008 | Moshiri et al. | | |
| 2011/0077889 A1* | 3/2011 | Vogt | ............... | G01C 17/38 702/93 |
| 2011/0106477 A1* | 5/2011 | Brunner | ............... | G01R 33/0035 702/104 |

OTHER PUBLICATIONS

Bonnet et al., "Calibration methods for inertial and magnetic sensors", 2009, Sensors and Actuators A 156 (2009) 302-311.*

Vasconcelos Et Al., "Geometric Approach to Strapdown Magnetometer Calibration in Sensor Frame", 2011, Ieee Transactions on Aerospace and Electronic Systems vol. 47, No. 2 Apr. 2011.*

International Preliminary Report on Patentability issued in corresponding International application No. PCT/US2011/061168, dated May 30, 2013.

Thomas Bak; "Spacecraft Attitude Determination—a Magnetometer Approach"; Ph.D. Thesis, Department of Control Engineering, Aalborg University; ISBN 87-90664-03-5; Aug. 1999; pp. 1-192; Denmark.

D. A. Turner, et al.; "An algorithm for fitting an ellipsoid to data"; University of Huddersfield, Queensgate, Huddersfield, HD1 3DH, UK; National Physical Laboratory; Dec. 1, 1999; pp. 1-12; Teddington, Middlesex, UK.

International Search Report issued in corresponding International application No. PCT/US2011/061168, dated May 17, 2012.

Alonso, R. et al., "Complete Linear Attitude-Independent Magnetometer Calibration," The Journal of Astronautical Sciences, 50(4), pp. 477-490, Oct.-Dec. 2002.

D. Gebre-Egziabher, et al.; "Calibration of Strapdown Magnetometers in Magnetic Field Doman"; Journal of Aerospace Engineering, ASCE; Apr. 2006; pp. 87-102.

* cited by examiner

APPARATUSES AND METHODS FOR CALIBRATING MAGNETOMETER ATTITUDE-INDEPENDENT PARAMETERS

RELATED APPLICATION

This application is a 371 U.S. National Stage entry of PCT Application No. PCT/US2011/061168, filed Nov. 17, 2011, which is related to, and claims priority from, U.S. Provisional Patent Application Ser. No. 61/414,570, entitled "Magnetometer Attitude Independent Parameter Calibration In Closed Form", filed on Nov. 17, 2010, the disclosure of which is incorporated here by reference.

TECHNICAL FIELD

The present inventions generally relate to apparatuses and methods for calibrating (i.e., determining) a complete set of attitude-independent parameters (scale, non-orthogonality/skew/cross-coupling, offset) of a three-axis magnetometer (TAM). Accuracy of the attitude-independent parameters is also calculated.

BACKGROUND

The increasingly popular and widespread mobile devices frequently include so-called nine-axis sensors which consist of a 3-axis (3-D) gyroscope, a 3-axis (3-D) accelerometer and a 3-axis (3-D) magnetometer. The 3-D gyroscope measures angular velocities. The 3-D accelerometer measures linear acceleration. The 3-D magnetometer measures a local magnetic field vector (or a deviation thereof). In spite of their popularity, the foreseeable capabilities of these nine-axis sensors are not fully exploited due to the difficulty of calibrating and removing undesirable effects from the magnetometer measurements on one hand, and the practical impossibility to make a reliable estimate of the yaw angle using only the gyroscopes and the accelerometer.

A rigid body's (i.e., by rigid body designating any device to which the magnetometer and motion sensors are attached) 3-D angular position with respect to an Earth-fixed gravitational orthogonal reference system is uniquely defined. When a magnetometer and an accelerometer are used, it is convenient to define the gravitational reference system as having the positive Z-axis along gravity, the positive X-axis pointing to magnetic North and the positive Y-axis pointing East. The accelerometer senses gravity defining the z-axis, and the magnetometer measurement is used to infer the magnetic North based on the Earth's magnetic field (noting here that it is known that the angle between the Earth's magnetic field and gravity is may be different from)90°). This manner of defining the axis of a gravitational reference system is not intended to be limiting. Other definitions of an orthogonal right-hand reference system may be derived based on the two known directions, gravity and the magnetic North.

Figure 2:
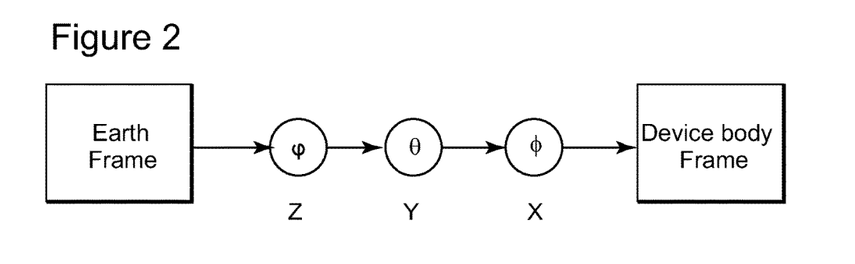
FIG. 2 is an illustration of a transition from a gravitational reference system to a body reference system.

Based on Euler's theorem, the body reference system and the gravitational reference system (as two orthogonal right-hand coordinate systems) can be related by a sequence of rotations (not more than three) about coordinate axes, where successive rotations are about different axis. A sequence of such rotations is known as an Euler angle-axis sequence. Such a reference rotation sequence is illustrated in FIG. 2. The angles of these rotations are angular positions of the device in the gravitational reference system.

A 3-D magnetometer measures a 3-D magnetic field representing an overlap of a 3-D static magnetic field (e.g., Earth's magnetic field), hard- and soft-iron effects, and a 3-D dynamic near field due to external time dependent electromagnetic fields. The measured magnetic field depends on the actual orientation of the magnetometer. If the hard-iron effects, soft-iron effects and dynamic near fields were zero, the locus of the measured magnetic field (as the magnetometer is oriented in different directions) would be a sphere of radius equal to the magnitude of the Earth's magnetic field. The non-zero hard- and soft-iron effects render the locus of the measured magnetic field to be an ellipsoid offset from origin.

Hard-iron effect is produced by materials that exhibit a constant magnetic field with respect to the magnetometer's body frame overlapping the Earth's magnetic field, thereby generating constant offsets of the components of the measured magnetic field. As long as the orientation and position of the sources of magnetic field resulting in the hard-iron effects relative to the magnetometer is not changing, the corresponding offsets are also constant.

Unlike the hard-iron effect that yields a constant magnetic field in the magnetometer's body frame, the soft-iron effect is the result of material that influences, or distorts, a magnetic field (such as, iron and nickel), but does not necessarily generate a magnetic field itself. Therefore, the soft-iron effect is a distortion of the measured field depending upon the location and characteristics of the material causing the effect relative to the magnetometer and to the Earth's magnetic field. Thus, soft-iron effects cannot be compensated with simple offsets, requiring a more complicated procedure.

Conventional methods (e.g., J. F. Vasconcelos et al., *A Geometric Approach to Strapdown Magnetometer Calibration in Sensor Frame*, Proceeding of IFAC Workshop on Navigation, Guidance, and Control of Underwater Vehicles (NGCUV), Killaloe, Ireland, Volume 2, 2008, and R. Alonso and M. D. Shuster. *Complete linear attitude-independent magnetometer calibration*, The Journal of the Astronautical Sciences, 50(4):477-490, October-December 2002) use nonlinear least square fit techniques to determine the attitude-independent parameters. These methods may diverge or converge to a local minimum instead of a global minimum issue, require iterations and two steps to determine a solution.

Another known method (D. Gebre-Egziabher et al., *Calibration of Strapdown Magnetometers in Magnetic Field Domain*. ASCE Journal of Aerospace Engineering, 19(2):1-16, April 2006) determines some of the attitude-independent parameters analytically but yields an incomplete solution which does not account for skew, and, therefore, determining only 6 of the total 9 parameters based on the assumption that the skew is zero.

Therefore, it would be desirable to provide devices, systems and methods that enable real-time reliable use of a magnetometer together with other motion sensors attached to a device for determining orientation of the device (i.e., angular positions including a yaw angle), while avoiding the afore-described problems and drawbacks.

SUMMARY

Devices, systems and methods use a three-axis magnetometer (TAM) alone to determine its complete set of attitude-independent parameters (scale, non-orthogonality/skew/cross-coupling, offset) for calibrating its own manufacture error and those equivalent resulting from embedded hard-iron and soft-iron effects and to calculate accuracy of the determined attitude-independent parameters.

According to one exemplary embodiment, a method for calibrating attitude-independent parameters of a 3-D magnetometer is provided. The method includes storing and updating data related to a N×9 matrix T and a N×1 matrix U extended for each measurement with an additional row and an additional element, respectively, the additional row and the additional element being calculated based values measured by the 3-D magnetometer for the respective measurement. The method further includes calculating analytically (1) a symmetric non-orthogonal 3×3 matrix D representing scaling and skew of the 3-D magnetometer measured values and (2) a vector b representing bias of the 3-D magnetometer measured values, using the stored data and a singular value decomposition (SVD) method.

According to another exemplary embodiment, an apparatus configured to perform a calibration of attitude-independent parameters of a 3-D magnetometer includes an interface configured to receive field values measured on three axes by the 3-D magnetometer and a data processing unit. The data processing unit is configured (i) to store and update data related to a N×9 matrix T and a N×1 matrix U representing N measurements, after each measurement making the data correspond to an additional row of matrix T and an additional element of matrix U calculated using the received field values, and (ii) to calculate analytically (1) a symmetric non-orthogonal 3×3 matrix D representing scaling and skew of the 3-D magnetometer measured values and (2) a vector b representing bias of the 3-D magnetometer measured values, using the stored data and a singular value decomposition (SVD) method.

According to another exemplary embodiment, a computer readable medium storing executable codes which when executed by a processor make the processor execute a method for calibrating attitude-independent parameters of a 3-D magnetometer is provided. The method includes storing and updating data related to a N×9 matrix T and a N×1 matrix U extended for each measurement with an additional row and an additional element, respectively, the additional row and the additional element being calculated based values measured by the 3-D magnetometer for the respective measurement. The method further includes calculating analytically (1) a symmetric non-orthogonal 3×3 matrix D representing scaling and skew of the 3-D magnetometer measured values and (2) a vector b representing bias of the 3-D magnetometer measured values, using the stored data and a singular value decomposition (SVD) method.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of a sensing unit including a magnetometer attached to a rigid 3-D body ("the device"). However, the embodiments to be discussed next are not limited to these systems but may be used in other systems including a 3-D magnetometer or other sensor with similar properties.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification is not necessarily all referring to the same embodiment. Further, the particular features, structures or characteristics may be combined in any suitable manner in one or more embodiments.

Figure 3:
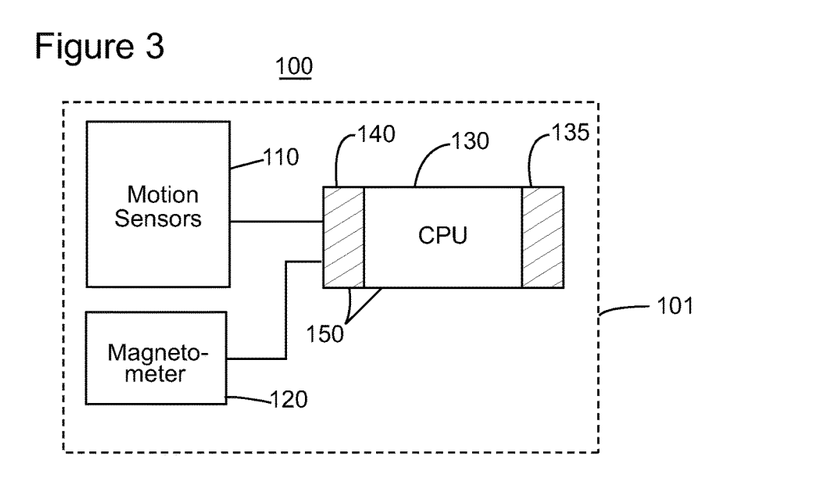
FIG. 3 is a block diagram of a sensing unit, according to an exemplary embodiment.

According to an exemplary embodiment illustrated in FIG. 3, a sensing unit 100 that may be attached to a device in order to monitor the device's orientation includes motion sensors 110 and a magnetometer 120 attached to the device's rigid body 101. Concurrent measurements performed by the motion sensors 110 and the magnetometer 120 yield signals sent to a data processing unit 130 via an interface 140. In FIG. 3, the data processing unit 130 is located on the rigid body 101. However, in an alternative embodiment, the data processing unit 130 may be remote, signals from the magnetometer 120 and the motion sensors 110 being transmitted to the data processing unit 130 by a transmitter located on the device. The data processing unit 130 includes at least one processor. The interface 140 and the data processing unit 130 constitute a magnetometer calibration unit 150. Note that for the purpose of calibrating the attitude independent parameters presence of the motion sensors 110 and the information acquired using these sensors and, the presence of these sensors, are not necessary.

Figure 1:
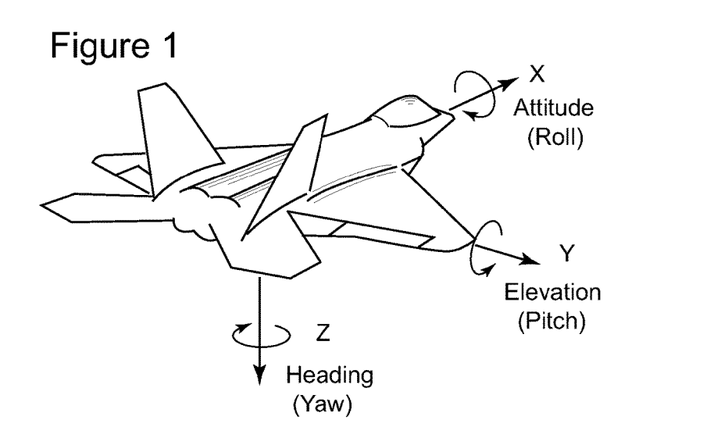
FIG. 1 is an illustration of a 3-D body reference system.

A body coordinate system may be defined relative to the device's body 101 (see, e.g., FIG. 1). The motion sensors 110 and the magnetometer 120 being fixedly attached to the rigid body 101, they generate signals related to observable (e.g., magnetic field, angular speed or linear acceleration) in the body reference system. If the motion sensors are not present, the magnetometer 120 fixedly attached to the rigid body 101 generates signals related to magnetic field in the body reference system.

Methods of calibrating the attitude-independent parameters that may be performed in the system 100 are described below. The data processing 130 may be connected to a computer readable medium 135 storing executable codes which, when executed, make the system 100 to perform calibration of the attitude-independent parameters. A method of calibrating the attitude-independent parameters may be performed for each data set of measurements received from the magnetometer but it is not required.

In the methods for calibrating attitude-independent parameters (scale, non-orthogonality/skew/cross-coupling, offset) of a three-axis magnetometer described below, the attitude-independent parameters are obtained as an analytical solution in a mathematical closed form (i.e., analytically), so that no divergence or convergence to a local minimum occurs. Moreover, no iterative computation is required, while the method can be performed in real time. Estimation accuracy of the parameters may be used to determine whether the calibration needs to be repeated for another measurement from the magnetometer at the same or different orientation or the current parameter values meet a desired accuracy criterion.

Figure 4:
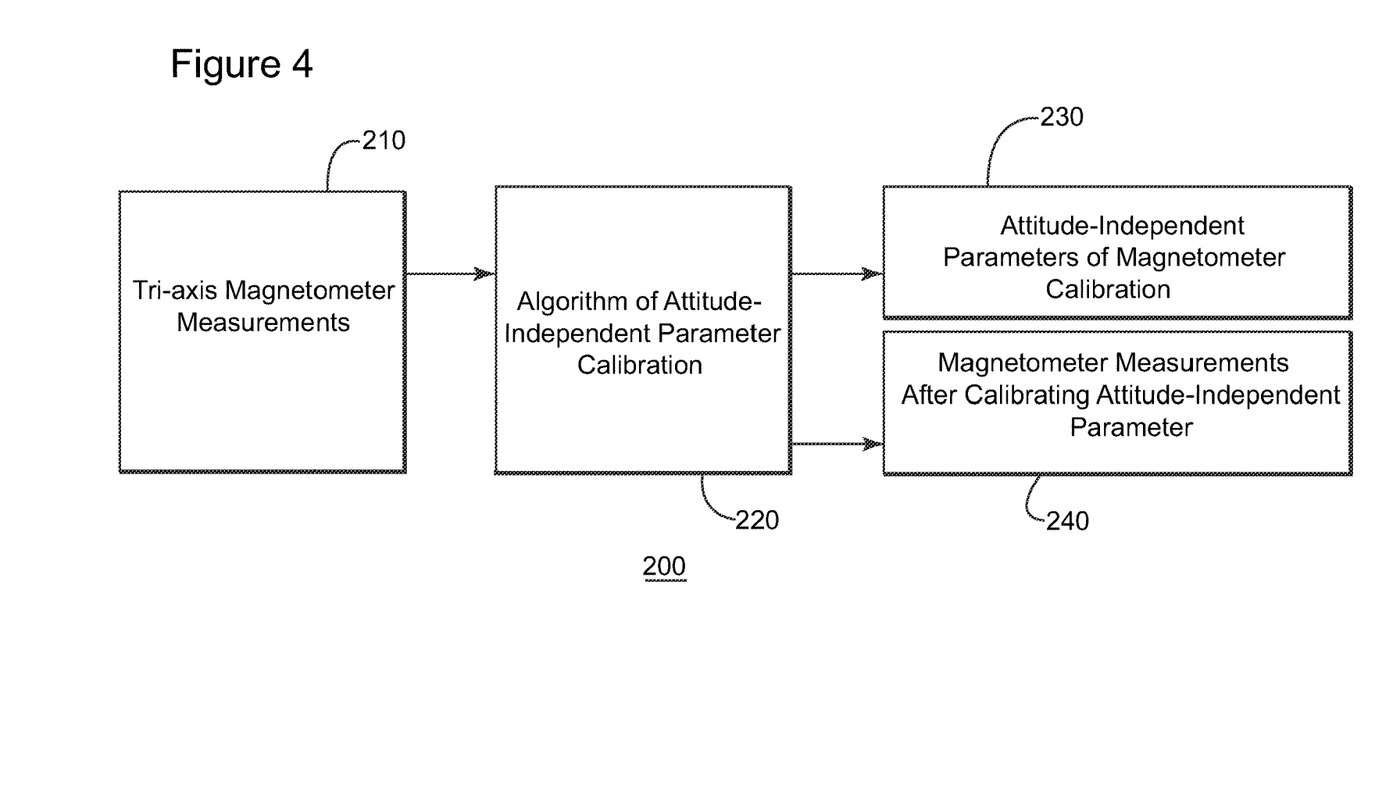
FIG. 4 is a block diagram of a method for calibrating the attitude-independent parameters according to an exemplary embodiment.

FIG. 4 is a block diagram of a method 200 for calibrating the attitude-independent parameters, according to an exemplary embodiment. The method 200 has as an input 210, raw measurements from a 3-D magnetometer. Using this input, an algorithm 220 outputs the set of attitude-independent parameters 230 and a value of the currently measured 3-D magnetic field 240 that is calculated using the attitude-independent parameters 230.

Figure 5:
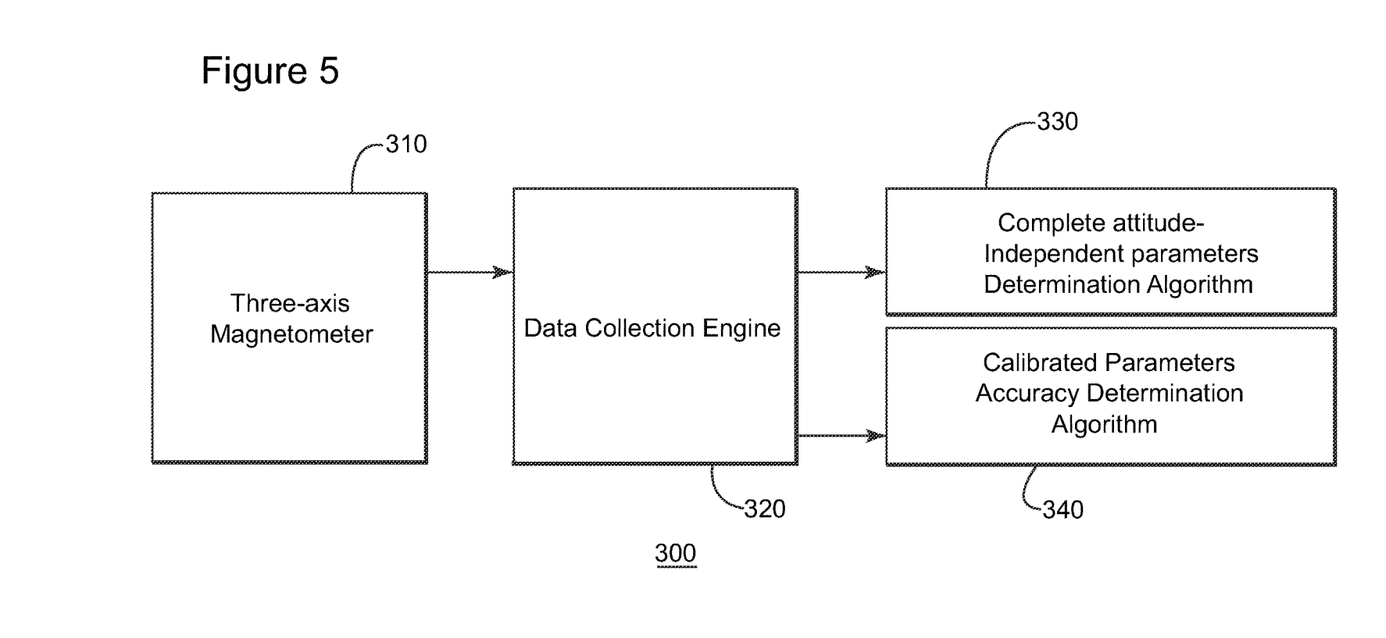
FIG. 5 is a block diagram of a system used for collecting data to be used to calibrate the attitude-independent parameters, according to an exemplary embodiment.

A system 300 used for collecting data to be used to calibrate the attitude-independent parameters is illustrated in FIG. 5. The system 300 consists of four blocks: sensing elements 310, a data collection engine 320, a parameter determination unit 330, and an accuracy estimation unit 340.

The sensor elements 310 output noisy and distorted signals representing sensed magnetic field values. The data collection block 320 prepares for parameter determination by accumulating the sensor data, sample-by-sample (e.g., measurement by measurement, for each time step). The parameter determination unit 330 computes the attitude-independent parameters to calibrate the sensor elements to provide a measurement of constant amplitude. The accuracy estimation unit 340 computes the error of the computed attitude-independent parameters, which indicates whether a pre-determined desired accuracy has been achieved.

The following Table 1 is a list of notations used to explain the algorithms related to the method for calibrating the attitude-independent parameters.

TABLE 1

| Notation | Unit | Description |
|---|---|---|
| $H, {}^E\vec{H}$ | Gauss | Actual earth magnetic field vector in the earth-fixed reference system |
| $B_k$ | Gauss | The measurement vector of the magnetic field by the magnetometer including magnetic induction at time step $t_k$ in the sensor body reference system |
| $I_{3\times 3}$ | | A 3 × 3 identity matrix |
| D | | Symmetric 3 × 3 matrix |
| O | | Orthogonal matrix representing pure rotation for alignment |
| $A_k$ | | The rotation matrix representing the attitude of the sensor with respect to the Earth-fixed gravitational reference system |
| B | Gauss | The offset vector |
| $n_k$ | Gauss | The measurement noise vector at time step k that is assumed to be a zero-mean Gaussian process |
| $S_M$ | | Sensor scaling, a diagonal matrix |
| $C_{NO}$ | | Sensor transformation matrix |
| $C_{SI}$ | | Soft-iron transformation matrix |
| ${}^B_E R$ | | Rotation matrix from the Earth-fixed gravitational reference system to the device body reference system |
| $\vec{b}_{HI}$ | Gauss | Hard-iron effect vector |

TABLE 1-continued

| Notation | Unit | Description |
|---|---|---|
| $\vec{b}_M$ | Gauss | Sensor elements' intrinsic bias vector |
| $\vec{n}_M$ | Gauss | The Gaussian wideband noise vector on magnetometer measurement |
| × | | Matrix multiplication |
| · | | Dot product of two vectors |
| −1 | | Matrix inverse |
| T | | Matrix transpose |

The signals detected by the sensing elements of the magnetometer are distorted by the presence of ferromagnetic elements in their proximity. For example, the signals are distorted by the interference between the magnetic field and the surrounding installation materials, by local permanently magnetized materials, by the sensor's own scaling, cross-coupling, bias, and by technological limitations of the sensor, etc. The type and effect of magnetic distortions and sensing errors are described in many publicly available references such as W. Denne, *Magnetic Compass Deviation and Correction*, 3rd ed. Sheridan House Inc, 1979.

The three-axis magnetometer reading (i.e., the 3-D measured magnetic field) has been modeled in the reference "*A Geometric Approach to Strapdown Magnetometer Calibration in Sensor Frame*" by J. F. Vasconcelos et al., Proceeding of IFAC Workshop on Navigation, Guidance, and Control of Underwater Vehicles (NGCUV), Killaloe, Ireland, Volume 2, 2008, as $$\vec{B}_k = S_M \times C_{NO} \times (C_{SI} \times {}^B_E R_k \times {}^E \vec{H} + \vec{b}_{HI}) + \vec{b}_M + \vec{n}_{Mk}. \quad \text{Equation 1}$$

A more practical formulation from the reference "*Complete linear attitude-independent magnetometer calibration*" in The Journal of the Astronautical Sciences, 50(4): 477-490, October-December 2002 by R. Alonso and M. D. Shuster and without loss of generality is:

$$B_k = (I_{3\times 3} + D)^{-1} \times (O \times A_k \times H + b + n_k) \quad \text{Equation 2}$$

where D combines scaling and skew from both sensor contribution and soft-iron effects, O is the misalignment matrix combining both soft-iron effects and sensor's internal alignment error with respect to the Earth-fixed gravitational reference system, b is the bias due to both hard-iron effects and sensor's intrinsic contribution, n is the transformed sensor measurement noise vector with zero mean and constant standard deviation of σ.

Since both O and $A_k$ only change the direction of the vector, the magnitude of $O \times A_k \times H$ is a constant invariant of the orientation of magnetometer with respect to the Earth-fixed body reference system. Given that the points $O \times A_k \times H$ are constrained to the sphere, the magnetometer reading $B_k$ lies on an ellipsoid.

For any set of $B_k$, i.e. any portion of the ellipsoid, method of determining D and b simultaneously, analytically, with mathematical closed form are provided. Equation 2 is rewritten as $$(I_{3\times 3} + D) \times B_k - b = O \times A_k \times H + n_k \quad \text{Equation 3}$$

The magnitude square on both side of Equation 3 are also equal which yields $$|(I_{3\times 3} + D) \times B_k - b|^2 = |O \times A_k \times H|^2 + |n_k|^2 + 2 \cdot (O \times A_k \times H)^T \times n_k \quad \text{Equation 4}$$

Since $|O \times A_k \times H|^2 = |H|^2$, Equation 4 can be rewritten as $$|(I_{3\times 3} + D) \times B_k - b|^2 - |H|^2 = |n_k|^2 + 2 \cdot (O \times A_k \times H)^T \times n_k \quad \text{Equation 5}$$

The right side of Equation 5 being a noise term, the solution to the Equation 5 can be a least square fit of $|(I_{3\times 3} + D) \times B_k - b|^2$ to $|H|^2$ as $$\min_{(D,\vec{b})} \sum_{k=1}^{n} \frac{1}{\sigma_k^2} |||(I_{3\times 3} + D) \times B_k - b|^2 - |H|^2||^2, \quad \text{Equation 6}$$

and $|H|^2 = $ constant

However, since Equation 6 is a highly nonlinear function of D and b, there is no straightforward linear analytical solution.

Further, by using the definitions $$pD = I_{3\times 3} + D = \begin{bmatrix} pD_{11} & pD_{12} & pD_{13} \\ pD_{12} & pD_{22} & pD_{23} \\ pD_{13} & pD_{23} & pD_{33} \end{bmatrix} \quad \text{Equation 7}$$

$$E = pD \times pD \quad \text{Equation 8}$$
$$= \begin{bmatrix} pD_{11} & pD_{12} & pD_{13} \\ pD_{12} & pD_{22} & pD_{23} \\ pD_{13} & pD_{23} & pD_{33} \end{bmatrix} \times \begin{bmatrix} pD_{11} & pD_{12} & pD_{13} \\ pD_{12} & pD_{22} & pD_{23} \\ pD_{13} & pD_{23} & pD_{33} \end{bmatrix}$$

ignoring the noise in Equation 5, and $$|pD \times B_k - b|^2 = |H|^2 \quad \text{Equation 9}$$

expanding equation 9, the following relation is obtained $$\begin{bmatrix} pD_{11} \\ pD_{12} \\ pD_{13} \end{bmatrix}^T \times \begin{bmatrix} pD_{11} \\ pD_{12} \\ pD_{13} \end{bmatrix} \cdot B_x^2 + \begin{bmatrix} pD_{12} \\ pD_{22} \\ pD_{23} \end{bmatrix}^T \times \begin{bmatrix} pD_{12} \\ pD_{22} \\ pD_{23} \end{bmatrix} \cdot B_y^2 + \quad \text{Equation 10}$$

$$\begin{bmatrix} pD_{13} \\ pD_{23} \\ pD_{33} \end{bmatrix}^T \times \begin{bmatrix} pD_{13} \\ pD_{23} \\ pD_{33} \end{bmatrix} \cdot B_z^2 + 2 \begin{bmatrix} pD_{11} \\ pD_{12} \\ pD_{13} \end{bmatrix}^T \times \begin{bmatrix} pD_{12} \\ pD_{22} \\ pD_{23} \end{bmatrix} \cdot B_x \cdot B_y +$$

$$2 \cdot \begin{bmatrix} pD_{11} \\ pD_{12} \\ pD_{13} \end{bmatrix}^T \times \begin{bmatrix} pD_{13} \\ pD_{23} \\ pD_{33} \end{bmatrix} \cdot B_x \cdot B_z +$$

$$2 \cdot \begin{bmatrix} pD_{12} \\ pD_{22} \\ pD_{23} \end{bmatrix}^T \times \begin{bmatrix} pD_{13} \\ pD_{23} \\ pD_{33} \end{bmatrix} \cdot B_y \cdot B_z -$$

$$2 \cdot \begin{bmatrix} pD_{11} \\ pD_{12} \\ pD_{13} \end{bmatrix}^T \times \begin{bmatrix} b_x \\ b_y \\ b_z \end{bmatrix} \cdot B_x - 2 \cdot \begin{bmatrix} pD_{12} \\ pD_{22} \\ pD_{23} \end{bmatrix}^T \times \begin{bmatrix} b_x \\ b_y \\ b_z \end{bmatrix} \cdot B_y -$$

$$2 \cdot \begin{bmatrix} pD_{13} \\ pD_{23} \\ pD_{33} \end{bmatrix}^T \times \begin{bmatrix} b_x \\ b_y \\ b_z \end{bmatrix} \cdot B_z + \begin{bmatrix} b_x \\ b_y \\ b_z \end{bmatrix}^T \times \begin{bmatrix} b_x \\ b_y \\ b_z \end{bmatrix} - |H|^2 = 0$$

To simplify Equation 10, Q elements are defined as follows:

$$Q(1) = \begin{bmatrix} pD_{11} \\ pD_{12} \\ pD_{13} \end{bmatrix}^T \times \begin{bmatrix} pD_{11} \\ pD_{12} \\ pD_{13} \end{bmatrix}, \quad \text{Equation 11}$$

$$Q(2) = \begin{bmatrix} pD_{12} \\ pD_{22} \\ pD_{23} \end{bmatrix}^T \times \begin{bmatrix} pD_{12} \\ pD_{22} \\ pD_{23} \end{bmatrix},$$

$$Q(3) = \begin{bmatrix} pD_{13} \\ pD_{23} \\ pD_{33} \end{bmatrix}^T \times \begin{bmatrix} pD_{13} \\ pD_{23} \\ pD_{33} \end{bmatrix},$$

$$Q(4) = \begin{bmatrix} pD_{11} \\ pD_{12} \\ pD_{13} \end{bmatrix}^T \times \begin{bmatrix} pD_{12} \\ pD_{22} \\ pD_{23} \end{bmatrix},$$

$$Q(5) = \begin{bmatrix} pD_{11} \\ pD_{12} \\ pD_{13} \end{bmatrix}^T \times \begin{bmatrix} pD_{13} \\ pD_{23} \\ pD_{33} \end{bmatrix},$$

$$Q(6) = \begin{bmatrix} pD_{12} \\ pD_{22} \\ pD_{23} \end{bmatrix}^T \times \begin{bmatrix} pD_{13} \\ pD_{23} \\ pD_{33} \end{bmatrix},$$

$$Q(7) = \begin{bmatrix} pD_{11} \\ pD_{12} \\ pD_{13} \end{bmatrix}^T \times \begin{bmatrix} b_x \\ b_y \\ b_z \end{bmatrix},$$

$$Q(8) = \begin{bmatrix} pD_{12} \\ pD_{22} \\ pD_{23} \end{bmatrix}^T \times \begin{bmatrix} b_x \\ b_y \\ b_z \end{bmatrix},$$

$$Q(9) = \begin{bmatrix} pD_{13} \\ pD_{23} \\ pD_{33} \end{bmatrix}^T \times \begin{bmatrix} b_x \\ b_y \\ b_z \end{bmatrix},$$

$$Q(10) = \begin{bmatrix} b_x \\ b_y \\ b_z \end{bmatrix}^T \times \begin{bmatrix} b_x \\ b_y \\ b_z \end{bmatrix} - |H|^2$$

Then, based on Equation 8, E is $$E = \begin{bmatrix} \begin{bmatrix} pD_{11} \\ pD_{12} \\ pD_{13} \end{bmatrix}^T \times \begin{bmatrix} pD_{11} \\ pD_{12} \\ pD_{13} \end{bmatrix} & \begin{bmatrix} pD_{11} \\ pD_{12} \\ pD_{13} \end{bmatrix}^T \times \begin{bmatrix} pD_{12} \\ pD_{22} \\ pD_{23} \end{bmatrix} & \begin{bmatrix} pD_{11} \\ pD_{12} \\ pD_{13} \end{bmatrix}^T \times \begin{bmatrix} pD_{13} \\ pD_{23} \\ pD_{33} \end{bmatrix} \\ \begin{bmatrix} pD_{11} \\ pD_{12} \\ pD_{13} \end{bmatrix}^T \times \begin{bmatrix} pD_{12} \\ pD_{22} \\ pD_{23} \end{bmatrix} & \begin{bmatrix} pD_{12} \\ pD_{22} \\ pD_{23} \end{bmatrix}^T \times \begin{bmatrix} pD_{12} \\ pD_{22} \\ pD_{23} \end{bmatrix} & \begin{bmatrix} pD_{12} \\ pD_{22} \\ pD_{23} \end{bmatrix}^T \times \begin{bmatrix} pD_{13} \\ pD_{23} \\ pD_{33} \end{bmatrix} \\ \begin{bmatrix} pD_{11} \\ pD_{12} \\ pD_{13} \end{bmatrix}^T \times \begin{bmatrix} pD_{13} \\ pD_{23} \\ pD_{33} \end{bmatrix} & \begin{bmatrix} pD_{12} \\ pD_{22} \\ pD_{23} \end{bmatrix}^T \times \begin{bmatrix} pD_{13} \\ pD_{23} \\ pD_{33} \end{bmatrix} & \begin{bmatrix} pD_{13} \\ pD_{23} \\ pD_{33} \end{bmatrix}^T \times \begin{bmatrix} pD_{13} \\ pD_{23} \\ pD_{33} \end{bmatrix} \end{bmatrix} \quad \text{Equation 12}$$

$$= \begin{bmatrix} Q(1) & Q(4) & Q(5) \\ Q(4) & Q(2) & Q(6) \\ Q(5) & Q(6) & Q(7) \end{bmatrix}$$

Matrix pD can be determined using a singular value decomposition (SVD) method $$u \times s \times v' = svd(E) \quad \text{equation 13}$$

where s is a 3×3 diagonal matrix. Then applying square root on each element of S, one obtains another 3×3 diagonal matrix w and then pD as:

$$w = \operatorname{sqrt}(s) \quad \text{Equation 14}$$

$$pD = u \times w \times v' \quad \text{Equation 15}$$

Offset b is calculated as $$b = (pD)^{-1} \times \begin{bmatrix} Q(7) \\ Q(8) \\ Q(9) \end{bmatrix} \quad \text{Equation 16}$$

In order to determine Q, an average over the three magnitudes of Q(1), Q(2), and Q(3) is defined as $$co = \frac{Q(1) + Q(2) + Q(3)}{3} \quad \text{Equation 17}$$

Using a new parameter vector K $$k = \left[ \frac{Q(1) - Q(3)}{3 \cdot co} \quad \frac{Q(1) - Q(2)}{3 \cdot co} \quad \frac{Q(4)}{co} \quad \frac{Q(5)}{co} \quad \frac{Q(6)}{co} \quad \frac{Q(7)}{co} \quad \frac{Q(8)}{co} \quad \frac{Q(9)}{co} \quad \frac{Q(10)}{co} \right]^T \quad \text{Equation 18}$$

Equation 10 becomes $$[B_x^2 + B_y^2 - 2B_z^2 \quad B_x^2 - 2B_y^2 + B_z^2 \quad 2B_x \cdot B_y \quad 2B_x \cdot B_z \quad 2 \cdot B_y \cdot B_z \quad -2B_x \quad -2B_y \quad -2B_z \quad 1] \times K = -(B_x^2 + B_y^2 + B_z^2) \quad \text{Equation 19}$$

Let's define an N×9 matrix T and an N×1 vector U $$T = \begin{bmatrix} [B_x^2 + B_y^2 - 2B_z^2 \quad B_x^2 - 2B_y^2 + B_z^2 \quad 2B_x \cdot B_y \quad 2B_x \cdot B_z \quad 2 \cdot B_y \cdot B_z \quad -2B_x \quad -2B_y \quad -2B_z \quad 1]_1 \\ \ldots \\ [B_x^2 + B_y^2 - 2B_z^2 \quad B_x^2 - 2B_y^2 + B_z^2 \quad 2B_x \cdot B_y \quad 2B_x \cdot B_z \quad 2 \cdot B_y \cdot B_z \quad -2B_x \quad -2B_y \quad -2B_z \quad 1]_N \end{bmatrix} \quad \text{Equation 20}$$

$$U = \begin{bmatrix} -(B_x^2 + B_y^2 + B_z^2)_1 \\ \ldots \\ -(B_x^2 + B_y^2 + B_z^2)_N \end{bmatrix} \quad \text{Equation 21}$$

With this notation, for N sample measurements Equation 19 becomes $$T \times K = U \quad \text{Equation 22}$$

and can be solved by $$K = (T^T \times T)^{-1} \times T^T \times U. \quad \text{Equation 23}$$

Then from Equations 18 and 12, E may be written as $$E = co \cdot \begin{bmatrix} 1 + K(1) + K(2) & K(3) & K(4) \\ K(3) & 1 + K(1) - 2K(2) & K(5) \\ K(4) & K(5) & 1 - 2K(1) + K(2) \end{bmatrix} \quad \text{Equation 24}$$

Let's define $$F = \begin{bmatrix} 1 + K(1) + K(2) & K(3) & K(4) \\ K(3) & 1 + K(1) - 2K(2) & K(5) \\ K(4) & K(5) & 1 - 2K(1) + K(2) \end{bmatrix} = G \times G \quad \text{Equation 25}$$

Matrix G is then determined in the same manner as pD using Equations 13-15

$$pD = \operatorname{sqrt}(co) \cdot G \quad \text{Equation 26}$$

Vector b is calculated by combining Equations 16, 18 and 26

$$b = \operatorname{sqrt}(co) \cdot G^{-1} \times [K(6) \quad K(7) \quad K(8)]^T \quad \text{Equation 27}$$

Substituting the definition of K(9) in Equation 18 and Equation 27 into Equation 11, co is calculated as follows $$co = \frac{|H|^2}{[K(6) \quad K(7) \quad K(8)] \times F^{-1} \times [K(6) \quad K(7) \quad K(8)]^T - K(9)} \quad \text{Equation 28}$$

Finally, substituting Equation 28 into Equations 26 and 27, and then into Eq. 7, D and b are completely determined.

$|H|^2$ can be referred to be the square of the local geomagnetic field strength. Even if the strength has an unknown value, it can be preset to be any arbitrary constant, the only difference for the solution being a constant scale difference on all computed 9 elements (3 scale, 3 skew, and 3 offset) of all three axes.

Based on the above-explained formalism, in a real-time exemplary implementation, for each time step, the data collection engine 320 stores two variable matrices: one 9×9 fixed-size matrix named L is used to accumulate $T^T \times T$, and the other fixed-size 9×1 matrix variable named M is used to accumulate $T^T \times U$. At time step n+1, the matrices are updated according to the following equations $$L_{n+1} = L_n + (T_{n+1}^T \times T_{n-1}) \qquad \text{Equation 29}$$

$$M_{n+1} = M_n + (T_{n+1}^T \times U_{n+1}) \qquad \text{Equation 30}$$

$T_{n+1}$, which is the element at n+1 row of T, and $U_{n+1}$, which is the element at n+1 row of U, are functions of only magnetometer sample measurement at current time step. Then, based on Equation 23, K is determined and then, G is determined using Equations 13-15. A temporary variable b is calculated as $$\tilde{b} = G^{-1} \times [K(6)\ K(7)\ K(8)]^T \qquad \text{Equation 31}$$

The value of co is obtained by using this $\tilde{b}$ into Equation 28 with a substitution of Equation 25. In addition, Equation 31 is substituted into Equation 27, and the calculated co is applied into Equations 26-27, and then, using Equation 7, D and b (i.e., the complete calibration set of attitude-independent parameters) are obtained.

The following algorithm may be applied to determine the accuracy of determining D and b. The error covariance matrix for the estimate of K is given by $$P_{KK} = \sigma_z^2 \cdot (L)^{-1} \qquad \text{Equation 32}$$

where $$\sigma_z^2 = 12 \cdot |H|^2 \cdot \sigma^2 + 6 \cdot \sigma^4 \qquad \text{Equation 33}$$

The Jacobian matrix of K with respect to the determined parameters $$J = [b_x\ b_y\ b_z\ pD_{11}\ pD_{22}\ pD_{33}\ pD_{12}\ pD_{13}\ pD_{23}]^T \qquad \text{Equation 34}$$

is given as follows

Thus, the error covariance matrix of the estimate of J is given by $$P_{JJ} = \left(\frac{\partial K}{\partial J}\right)^{-1} \times P_{KK} \times \left(\frac{\partial K}{\partial J}\right)^{-1} \qquad \text{Equation 38}$$

and the error of the estimate J is $$\varepsilon_J = \text{sqrt}(\text{diag}(P_{JJ})) \qquad \text{Equation 39}$$

The methods for calibrating attitude-independent parameters according to the above-detailed formalism can be applied to calibrate any sensor which measures a constant physical quality vector in the earth-fixed reference system, such as accelerometer measuring the earth gravity.

These methods can be applied to compute the complete parameter set to fit any ellipsoid to a sphere, where the ellipsoid can be offset from the origin and/or can be skewed. The methods provide a complete solution for all attitude-independent magnetometer calibration parameters analytically, i.e., a closed-form solution, which renders the calibration faster and avoids the divergence issue other existing methods face.

The methods can be used for dynamic time-varying $|H|^2$ as well as long as $|H|^2$ is known for each sample measurement.

The manner of defining co may be different from Equation 17, for example, other linear combinations of Q(1), Q(2), and Q(3) leading to similar or even better results. The general form of such linear combination is:

$$co = a_1 \cdot Q(1) + a_2 \cdot Q(2) + a_3 \cdot Q(3) \qquad \text{Equation 40}$$

where the sum of those coefficients is 1, i.e., :

$$a_1 + a_2 + a_3 = 1 \qquad \text{Equation 41}$$

The equations 20 and 21 can be extended to take measurement noise in different samples into account, the extended equations using the inverse of noise variances as weights:

$$\frac{\partial K}{\partial J} = \frac{1}{co} \cdot (Y_1 - Y_2) \qquad \text{Equation 35}$$

$$Y_1 = \begin{bmatrix} 0 & 0 & 0 & \frac{2}{3}pD_{11} & 0 & -\frac{2}{3}pD_{33} & \frac{2}{3}pD_{12} & 0 & -\frac{2}{3}pD_{23} \\ 0 & 0 & 0 & \frac{2}{3}pD_{11} & -\frac{2}{3}pD_{22} & 0 & 0 & \frac{2}{3}pD_{13} & -\frac{2}{3}pD_{23} \\ 0 & 0 & 0 & pD_{12} & pD_{12} & 0 & pD_{11}+pD_{22} & pD_{23} & pD_{13} \\ 0 & 0 & 0 & pD_{13} & 0 & pD_{13} & pD_{23} & pD_{11}+pD_{33} & pD_{12} \\ 0 & 0 & 0 & 0 & pD_{23} & pD_{23} & pD_{13} & pD_{12} & pD_{22}+pD_{33} \\ pD_{11} & pD_{12} & pD_{13} & b_x & 0 & 0 & b_y & b_z & 0 \\ pD_{12} & pD_{22} & pD_{23} & 0 & b_y & 0 & b_x & 0 & b_z \\ pD_{13} & pD_{23} & pD_{33} & 0 & 0 & b_z & 0 & b_x & b_y \\ 2b_x & 2b_y & 2b_z & 0 & 0 & 0 & 0 & 0 & 0 \end{bmatrix} \qquad \text{Equation 36}$$

$$Y_2 = K \times \begin{bmatrix} 0 & 0 & 0 & \frac{4}{3}pD_{11} & \frac{4}{3}pD_{22} & \frac{4}{3}pD_{33} & 2pD_{12} & 2pD_{13} & 2pD_{23} \end{bmatrix} \qquad \text{Equation 37}$$

$$T = \begin{bmatrix} \frac{1}{\sigma_1^2} \cdot [\; B_x^2 + B_y^2 - 2B_z^2 \quad B_x^2 - 2B_y^2 + B_z^2 \quad 2B_x \cdot B_y \quad 2B_x \cdot B_z \quad 2 \cdot B_y \cdot B_z \quad -2B_x \quad -2B_y \quad -2B_z \quad 1\;]_1 \\ \cdots \\ \frac{1}{\sigma_N^2} \cdot [\; B_x^2 + B_y^2 - 2B_z^2 \quad B_x^2 - 2B_y^2 + B_z^2 \quad 2B_x \cdot B_y \quad 2B_x \cdot B_z \quad 2 \cdot B_y \cdot B_z \quad -2B_x \quad -2B_y \quad -2B_z \quad 1\;]_N \end{bmatrix}$$

Equation 42

$$U = \begin{bmatrix} \frac{-1}{\sigma_1^2} \cdot (B_x^2 + B_y^2 + B_z^2)_1 \\ \cdots \\ \frac{-1}{\sigma_N^2} \cdot (B_x^2 + B_y^2 + B_z^2)_N \end{bmatrix}$$

Equation 43

Other functions of measurement error can also serve as weights for T and U in a similar manner.

Figure 6:
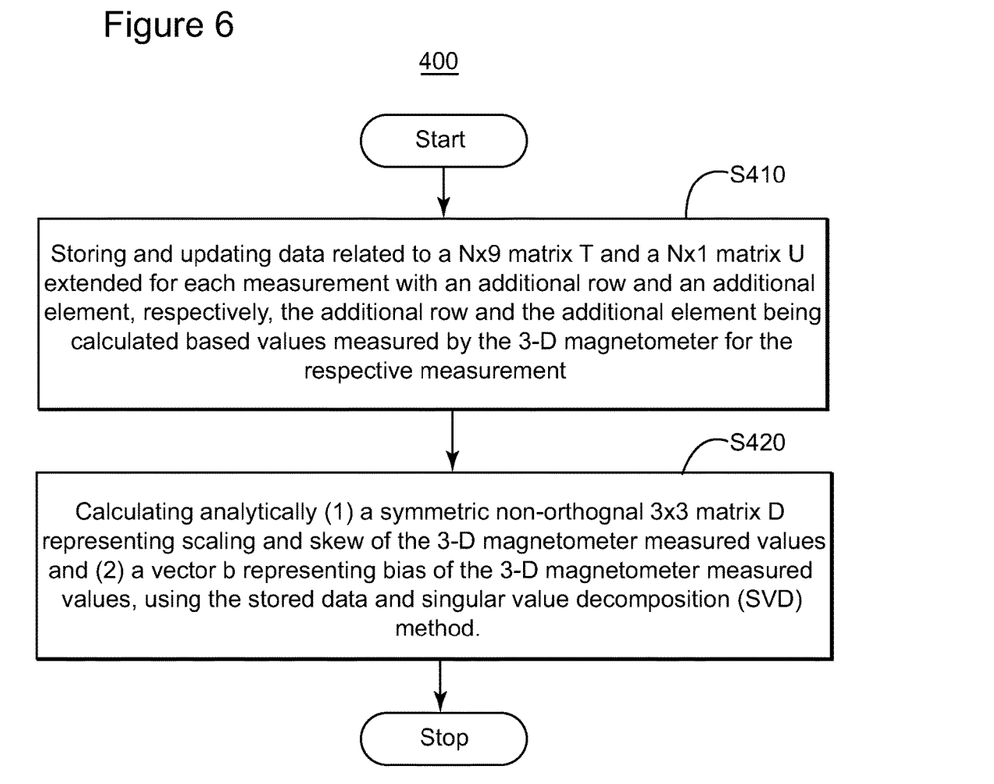
FIG. 6 is a flow diagram of a method for calibrating attitude-independent parameters of a 3-D magnetometer, according to an exemplary embodiment.

A flow diagram of a method 400 for calibrating attitude-independent parameters of a 3-D magnetometer is illustrated in FIG. 6. The method 400 includes storing and updating data related to a N×9 matrix T and a N×1 matrix U extended for each measurement with an additional row and an additional element, respectively, the additional row and the additional element being calculated based values measured by the 3-D magnetometer for the respective measurement, at 410. The method 400 further includes calculating analytically (1) a symmetric non-orthogonal 3×3 matrix D representing scaling and skew of the 3-D magnetometer measured values and (2) a vector b representing bias of the 3-D magnetometer measured values, using the stored data and a singular value decomposition (SVD) method, at S420. The method 400 may further include computing accuracy for the calculated symmetric non-orthogonal 3×3 matrix D and the vector b.

The disclosed exemplary embodiments provide methods that may be part of a toolkit useable when a magnetometer is used in combination with other sensors to determine orientation of a device, and systems capable to use the toolkit. The methods may be embodied in a computer program product. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Exemplary embodiments may take the form of an entirely hardware embodiment or an embodiment combining hardware and software aspects. Further, the exemplary embodiments may take the form of a computer program product stored on a computer-readable storage medium having computer-readable instructions embodied in the medium. Any suitable computer readable medium may be utilized including hard disks, CD-ROMs, digital versatile disc (DVD), optical storage devices, or magnetic storage devices such a floppy disk or magnetic tape. Other non-limiting examples of computer readable media include flash-type memories or other known memories.

Although the features and elements of the present exemplary embodiments are described in the embodiments in particular combinations, each feature or element can be used alone without the other features and elements of the embodiments or in various combinations with or without other features and elements disclosed herein. The methods or flow charts provided in the present application may be implemented in a computer program, software, or firmware tangibly embodied in a computer-readable storage medium for execution by a specifically programmed computer or processor.

What is claimed is:

1. A method for determining an orientation of a 3-D device, by calibrating attitude-independent parameters of a 3-D magnetometer attached to the 3-D device, the method comprising:
   receiving movement data of the 3-D device via the 3-D magnetometer;
   storing and updating data related to a T matrix of size N×9 and a U matrix of size N×1, each of the N rows of matrix T corresponding to a respective measured value of the 3-D magnetometer and comprising values calculated based on a first set of 9 functions of the respective measured value by the 3-D magnetometer, wherein N is a number of sample measurements by the 3-D magnetometer, and each of the N rows of matrix U corresponding to a respective measured of the 3-D magnetometer and comprising a value calculated based on a second function of the respective measured value by the 3-D magnetometer;
   calculating analytically (1)a symmetric nonorthogonal 3×3 matrix D representing scaling and skew of each axis of the 3-D magnetometer measured values and (2) a vector b representing bias of each axis of the 3-D magnetometer measured values, using the stored data and a singular value decomposition method; and
   wherein the calculating comprises:
   computing a vector $K = (T^T \times T)^{-1} \times T^T \times U$;
   generating a matrix F using elements of the vector K, and determining a matrix G, where $F = G \times G$, using a singular value decomposition method;
   determining a scale offset bias $$\tilde{b} = G^{-1} \times [K(6) K(7) k(8)]^T$$

determining a scale factor $$co = \frac{|H|^2}{[\; K(6) \quad K(7) \quad K(8)\;] \times F^{-1} \times [\; K(6) \quad K(7) \quad K(8)\;]^T - K(9)}$$

where $|H|^2$ is a square of local geomagnetic field strength;
   calculating the vector b =sqrt(co) $\tilde{b}$ and matrix pD =sqrt(co)·G ; and extracting the symmetric non-orthogonal 3×3 matrix $D=pD-1_{3\times 3}$, wherein $K(i)$ represents the $i^{th}$ element of vector K further wherein a 9×9 matrix L is used to accumulate $T^T \times T$, and a 9×1 matrix M is used to accumulate $T^T \times U$, wherein at time step n+1, matrix L and matrix M are updated according to:

$$L_{n+1} = L_n + (T_{n+1}^T \times T_{n+1})$$

$$M_{n+1} = M_n + (T_{n+1}^T \times U_{n+1})$$

wherein $T_{n+1}$, is an element at n+1 row of T, and $U_{n+1}$, is an element at n+1 row of U, and are functions of a magnetometer sample measurement at a current time step;

calibrating attitude-independent parameters of a 3-D magnetometer attached to the 3-D device using matrix D to compensate for soft iron effect and matrix b to compensate for hard iron effect; and determining an orientation of the device using the attitude-independent parameters.

2. The method of claim 1, wherein $$F = \begin{bmatrix} 1+K(1)+K(2) & K(3) & K(4) \\ K(3) & 1+K(1)-2K(2) & K(5) \\ K(4) & K(5) & 1-2K(1)+K(2) \end{bmatrix}.$$

3. The method of claim 1, wherein $$T = \begin{bmatrix} [B_x^2+B_y^2-2B_z^2 & B_x^2-2B_y^2+B_z^2 & 2B_x \cdot B_y & 2B_x \cdot B_z & 2 \cdot B_y \cdot B_z & -2B_x & -2B_y & -2B_z & 1]_1 \\ & & & \ldots & & & & & \\ [B_x^2+B_y^2-2B_z^2 & B_x^2-2B_y^2+B_z^2 & 2B_x \cdot B_y & 2B_x \cdot B_z & 2 \cdot B_y \cdot B_z & -2B_x & -2B_y & -2B_z & 1]_N \end{bmatrix}$$

and $$U = \begin{bmatrix} -(B_x^2+B_y^2+B_z^2)_1 \\ \ldots \\ -(B_x^2+B_y^2+B_z^2)_N \end{bmatrix},$$

wherein $B_x$ is a measurement of axis x, $B_y$ is a measurement of axis y, and $B_z$ is a measurement of axis z.

4. The method of claim 1, further comprising estimating accuracy of determining the symmetric non-orthogonal 3×3 matrix D and the vector b.

5. The method of claim 4, wherein the accuracy of determining the symmetric non-orthogonal 3×3 matrix D and the vector b is estimated by computing matrices $$Y_1 = \begin{bmatrix} 0 & 0 & 0 & \frac{2}{3}pD_{11} & 0 & -\frac{2}{3}pD_{33} & \frac{2}{3}pD_{12} & 0 & -\frac{2}{3}pD_{23} \\ 0 & 0 & 0 & \frac{2}{3}pD_{11} & -\frac{2}{3}pD_{22} & 0 & 0 & \frac{2}{3}pD_{13} & -\frac{2}{3}pD_{23} \\ 0 & 0 & 0 & pD_{12} & pD_{12} & 0 & pD_{11}+pD_{22} & pD_{23} & pD_{13} \\ 0 & 0 & 0 & pD_{13} & 0 & pD_{13} & pD_{23} & pD_{11}+pD_{33} & pD_{12} \\ 0 & 0 & 0 & 0 & pD_{23} & pD_{23} & pD_{13} & pD_{12} & pD_{22}+pD_{33} \\ pD_{11} & pD_{12} & pD_{13} & b_x & 0 & 0 & b_y & b_z & 0 \\ pD_{12} & pD_{22} & pD_{23} & 0 & b_y & 0 & b_x & 0 & b_z \\ pD_{13} & pD_{23} & pD_{33} & 0 & 0 & b_z & 0 & b_x & b_y \\ 2b_x & 2b_y & 2b_z & 0 & 0 & 0 & 0 & 0 & 0 \end{bmatrix}$$

$$Y_2 = K \times \begin{bmatrix} 0 & 0 & 0 & \frac{4}{3}pD_{11} & \frac{4}{3}pD_{22} & \frac{4}{3}pD_{33} & 2pD_{12} & 2pD_{13} & 2pD_{23} \end{bmatrix}$$

$$\frac{\partial K}{\partial J} = \frac{1}{co} \cdot (Y_1 - Y_2)$$

$$A = A + (T_{n+1}^T \times T_{n+1}) \text{ and}$$

$$P_{KK} = \sigma_z^2 \cdot A^{-1};$$

calculating an error covariance matrix $$P_{JJ} = \left(\frac{\partial K}{\partial J}\right)^{-1} \times P_{KK} \times \left(\frac{\partial K}{\partial J}\right)^{-1};$$

and
computing error of the elements of b and D as elements of $J=[b_x \, b_y \, b_z \, pD_{11} \, pD_{22} \, pD_{33} \, pD_{12} \, pD_{13} \, pD_{23}]^T$ according to $\varepsilon_J$=sqrt(diag($P_{JJ}$))
wherein $$pD = I_{3 \times 3} + D = \begin{bmatrix} pD_{11} & pD_{12} & pD_{13} \\ pD_{12} & pD_{22} & pD_{23} \\ pD_{13} & pD_{23} & pD_{33} \end{bmatrix}.$$

6. An apparatus for determining an orientation of a 3-D device, wherein the apparatus is configured to perform a calibration of attitude-independent parameters of a 3-D) magnetometer attached to the 3-D device, comprising:
an interface configured to receive field values measured on each of three axes by the 3-D magnetometer; and
a data processing unit configured
to receive movement data of the 3-D device via the 3-D magnetometer,
to store and update data related to a T matrix of size N×9 and a U matrix of size N×1 ,each of the N rows of matrix T responding to a respective measured value of the 3-D magnetometer and comprising values calculated based on a first set of 9 functions of the respective measured value by the 3-D magnetometer, each of the N rows of matrix U corresponds to a respective measured value by the 3-D magnetometer and comprises a value calculated based on a second function of the respective measured value by the 3-D magnetometer, wherein N is a number of sample measurements by the 3-D) magnetometer,
to calculate analytically (1) a symmetric non-orthogonal 3×3 matrix D representing scaling and skew of each axis of the 3-D magnetometer measured values and (2) a vector b representing bias of each axis of the 3-D magnetometer measured values, using the stored data and a singular value decomposition method, and
wherein the data processing unit is configured to calculate the symmetric non-orthogonal 3×3 matrix D and the vector b by: (1) computing a vector $K=(T^T \times T)^{-3} \times T^T \times U$;
(2) generating a matrix F using elements of the vector K, and determining a matrix G, where F=G×G, using a singular value decomposing method;
(3) determining a scale offset bias $\tilde{b} = G^{-1} \times [K(6) K(7) k(8)]^T$ (4) determining a scale factor $$co = \frac{|H|^2}{[K(6) \quad K(7) \quad K(8)] \times F^{-1} \times [K(6) \quad K(7) \quad K(8)]^T - K(9)}$$

where $|H|^2$ a square of local geomagnetic field strength;
(5) calculating the vector b =sqrt(co) b̃and matrix pD =sqrt(co)·G ; and
(6) extracting the symmetric non-orthogonal 3×3 matrix D =pD−$I_{3 \times 3}$ , wherein K(i) represents the $i^{th}$ element of vector K,
further wherein the data processing unit is configured to use a 9×9 matrix L is to accumulate $T^T \times T$ , and a 9×1 matrix M to accumulate $T^T \times U$ , wherein at time step n+1, matrix L and matrix M are updated according to:

$L_{n+1} = L_n + (T_{n+1}{}^T \times T_{n+1})$ $M_{n+1} = M_n + (T_{n+1}{}^T \times U_{n+1})$ wherein $T_{n+1}$, is an element at n+1 row of T, and $U_{n+1}$, is an element at n+1 row of U, and are functions of a magnetometer sample measurement at a current time step;
to calibrate attitude-independent parameters of a 3-D magnetometer attached to the 3-D) device using matrix D to compensate for soft iron effect and matrix b to compensate for hard iron effect; and
to determine an orientation of the device using the attitude-independent parameters.

7. The method of claim 6 further comprising:
determining if the 3-D magnetometer measured values meet a predetermined criterion; and
using the 3-D magnetometer measured values in the updating of the matrices T and U only if they meet the predetermined criterion.

8. The apparatus of claim 7, where $$F = \begin{bmatrix} 1 + K(1) + K(2) & K(3) & K(4) \\ K(3) & 1 + K(1) - 2K(2) & K(5) \\ K(4) & K(5) & 1 - 2K(1) + K(2) \end{bmatrix}.$$

9. The apparatus of claim 7, wherein $$T = \begin{bmatrix} [B_x^2 + B_y^2 - 2B_z^2 & B_x^2 - 2B_y^2 + B_z^2 & 2B_x \cdot B_y & 2B_x \cdot B_z & 2 \cdot B_y \cdot B_z & -2B_x & -2B_y & -2B_z & 1]_1 \\ & & & \ldots & & & & & \\ [B_x^2 + B_y^2 - 2B_z^2 & B_x^2 - 2B_y^2 + B_z^2 & 2B_x \cdot B_y & 2B_x \cdot B_z & 2 \cdot B_y \cdot B_z & -2B_x & -2B_y & -2B_z & 1]_N \end{bmatrix}$$

and $$U = \begin{bmatrix} -(B_x^2 + B_y^2 + B_z^2)_1 \\ \ldots \\ -(B_x^2 + B_y^2 + B_z^2)_N \end{bmatrix}.$$

wherein $B_x$ is a measurement of axis x, $B_y$ is a measurement of axis y, and $B_z$ is a measurement of axis z.

10. The apparatus of claim 7, wherein the data processing unit is further configured to estimate accuracy of determining the symmetric non-orthogonal 3×3 matrix D and the vector b.

11. The apparatus of claim 10, further wherein the data processing unit estimates the accuracy of determining the symmetric non-orthogonal 3×3 matrix D and the vector b is estimated by computing matrices $$Y_1 = \begin{bmatrix} 0 & 0 & 0 & \frac{2}{3}pD_{11} & 0 & -\frac{2}{3}pD_{33} & \frac{2}{3}pD_{12} & 0 & -\frac{2}{3}pD_{23} \\ 0 & 0 & 0 & \frac{2}{3}pD_{11} & -\frac{2}{3}pD_{22} & 0 & 0 & \frac{2}{3}pD_{13} & -\frac{2}{3}pD_{23} \\ 0 & 0 & 0 & pD_{12} & pD_{12} & 0 & pD_{11}+pD_{22} & pD_{23} & pD_{13} \\ 0 & 0 & 0 & pD_{13} & 0 & pD_{13} & pD_{23} & pD_{11}+pD_{33} & pD_{12} \\ 0 & 0 & 0 & 0 & pD_{23} & pD_{23} & pD_{13} & pD_{12} & pD_{22}+pD_{33} \\ pD_{11} & pD_{12} & pD_{13} & b_x & 0 & 0 & b_y & b_z & 0 \\ pD_{12} & pD_{22} & pD_{23} & 0 & b_y & 0 & b_x & 0 & b_z \\ pD_{13} & pD_{23} & pD_{33} & 0 & 0 & b_z & 0 & b_x & b_y \\ 2b_x & 2b_y & 2b_z & 0 & 0 & 0 & 0 & 0 & 0 \end{bmatrix}$$

$$Y_2 = K \times \begin{bmatrix} 0 & 0 & 0 & \frac{4}{3}pD_{11} & \frac{4}{3}pD_{22} & \frac{4}{3}pD_{33} & 2pD_{12} & 2pD_{13} & 2pD_{23} \end{bmatrix}$$

$$\frac{\partial K}{\partial J} = \frac{1}{co} \cdot (Y_1 - Y_2)$$

$$A = A + (T_{n+1}^T \times T_{n+1}) \text{ and }$$

$$P_{KK} = \sigma_z^2 \cdot A^{-1};$$

calculating an error covariance matrix $$P_{JJ} = \left(\frac{\partial K}{\partial J}\right)^{-1} \times P_{KK} \times \left(\frac{\partial K}{\partial J}\right)^{-1};$$

and
computing error of the elements of b and D as elements of $J=[b_x b_y b_z pD_{11} pD_{22} pD_{33} pD_{12} pD_{13} pD_{23}]^T$ according to $\varepsilon_J=\text{sqrt}(\text{diag}(P_{JJ}))$
wherein $$pD = I_{3\times3} + D = \begin{bmatrix} pD_{11} & pD_{12} & pD_{13} \\ pD_{12} & pD_{22} & pD_{23} \\ pD_{13} & pD_{23} & pD_{33} \end{bmatrix}.$$

12. The apparatus of claim 7 wherein the data processing unit is further configured to:
determine if the 3-D magnetometer measured values meet a predetermined criterion; and
use the 3-D magnetometer measured values in the updating of the matrices T and U only if they meet the predetermined criterion.

13. A non-transitory computer readable medium storing executable codes, which, when executed by a processor, make the processor execute a method for determining an orientation of a 3-D device by calibrating attitude-independent parameters of a 3-D magnetometer attached to the 3-D device, the method comprising
receiving movement data of the 3-D device via the 3-D magnetometer;
storing and updating data related to a T matrix of size N×9 and a U matrix of size N×1, each of the N rows of matrix T corresponding to a respective measured value of the 3-D magnetometer and comprising values calculated based on a first set of 9 functions of the respective measured value by the 3-D magnetometer, wherein N is a number of samples measurements by the 3-D magnetometer, and each of the N rows of matrix U corresponding to a respective measured vale of the 3-D magnetometer and comprising a value calculated based on a second function of the respective measured value by the 3-D magnetometer;
calculating analytically (1) a symmetric non-orthogonal 3×3 matrix D representing scaling and skew of each axis of the 3-D magnetometer measured values and (2) a vector b representing bias of each axis of the 3-D magnetometer measured values, using the stored data and a singular value decomposition method;
wherein the calculating comprises:
computing a vector $K=(T^T \times T)^{-1} \times T^T \times U$;
generating a matrix F using elements of the vector K, and determining a matrix G, where $F = G \times G$, using a singular value decomposition method:
determining a scale offset bias $$\bar{b} = G^{-1} \times [K(6) K(7) k(8)]^T$$

determining a scale factor $$co = \frac{|H|^2}{[K(6) \quad K(7) \quad K(8)] \times F^{-1} \times [K(6) \quad K(7) \quad K(8)]^T - K(9)}$$

where $|H|^2$ is a square of local geomagnetic field strength;
calculating the vector b =sqrt(co)·$\bar{b}$ and matrix pD =sqrt (co)·G ; and
extracting the symmetric non-orthogonal 3×3 matrix $D=pD-I_{3\times3}$, wherein K(i) represents the $i^{th}$ element of vector K, wherein a 9×9 matrix L is used to accumulate $T^{T \times T}$, and a 9×1 matrix M is used to accumulate $T^T \times U$, wherein at time step n+1, matrix L and matrix M are updated according to:

$$L_{n+1} = L_n + (T_{n+1}{}^T \times T_{n-1})$$

$$M_{n+1} = M_n + (T_{n+1}{}^T \times U_{n-1})$$

further wherein $T_{n+1}$ is an element at n+1 row of T, and $U_{n+1}$, is an element at n+1 row of U, and are functions of a magnetometer sample measurement at a current time step;

calibrating attitude-independent parameters of a 3-D magnetometer attached to the 3-D device using matrix D to compensate for soft iron effect and matrix b to compensate for hard iron effect and determining an orientation of the device using the attitude-independent parameters.

14. The computer readable medium of claim 13, where $$F = \begin{bmatrix} 1 + K(1) + K(2) & K(3) & K(4) \\ K(3) & 1 + K(1) - 2K(2) & K(5) \\ K(4) & K(5) & 1 - 2K(1) + K(2) \end{bmatrix}.$$

15. The computer readable medium of claim 13, wherein $$T = \begin{bmatrix} [B_x^2 + B_y^2 - 2B_z^2 & B_x^2 - 2B_y^2 + B_z^2 & 2B_x \cdot B_y & 2B_x \cdot B_z & 2 \cdot B_y \cdot B_z & -2B_x & -2B_y & -2B_z & 1]_1 \\ & & & & \cdots \\ [B_x^2 + B_y^2 - 2B_z^2 & B_x^2 - 2B_y^2 + B_z^2 & 2B_x \cdot B_y & 2B_x \cdot B_z & 2 \cdot B_y \cdot B_z & -2B_x & -2B_y & -2B_z & 1]_N \end{bmatrix}$$

and $$U = \begin{bmatrix} -(B_x^2 + B_y^2 + B_z^2)_1 \\ \cdots \\ -(B_x^2 + B_y^2 + B_z^2)_N \end{bmatrix}$$

wherein $B_x$ is a measurement of axis x, $B_y$ is a measurement of axis y, and $B_z$ is a measurement of axis z.

16. The computer readable medium of claim 13, wherein the method further comprises estimating accuracy of determining the symmetric non-orthogonal 3×3 matrix D and the vector b.

17. The computer readable medium of claim 16, wherein the method further comprising wherein the accuracy of determining the symmetric non-orthogonal 3×3 matrix D and the vector b is estimated by computing matrices $$Y_1 = \begin{bmatrix} 0 & 0 & 0 & \frac{2}{3}pD_{11} & 0 & -\frac{2}{3}pD_{33} & \frac{2}{3}pD_{12} & 0 & -\frac{2}{3}pD_{23} \\ 0 & 0 & 0 & \frac{2}{3}pD_{11} & -\frac{2}{3}pD_{22} & 0 & 0 & \frac{2}{3}pD_{13} & -\frac{2}{3}pD_{23} \\ 0 & 0 & 0 & pD_{12} & pD_{12} & 0 & pD_{11} + pD_{22} & pD_{23} & pD_{13} \\ 0 & 0 & 0 & pD_{13} & 0 & pD_{13} & pD_{23} & pD_{11} + pD_{33} & pD_{12} \\ 0 & 0 & 0 & 0 & pD_{23} & pD_{23} & pD_{13} & pD_{12} & pD_{22} + pD_{33} \\ pD_{11} & pD_{12} & pD_{13} & b_x & 0 & 0 & b_y & b_z & 0 \\ pD_{12} & pD_{22} & pD_{23} & 0 & b_y & 0 & b_x & 0 & b_z \\ pD_{13} & pD_{23} & pD_{33} & 0 & 0 & b_z & 0 & b_x & b_y \\ 2b_x & 2b_y & 2b_z & 0 & 0 & 0 & 0 & 0 & 0 \end{bmatrix}$$

$$Y_2 = K \times \begin{bmatrix} 0 & 0 & 0 & \frac{4}{3}pD_{11} & \frac{4}{3}pD_{22} & \frac{4}{3}pD_{33} & 2pD_{12} & 2pD_{13} & 2pD_{23} \end{bmatrix}$$

$$\frac{\partial K}{\partial J} = \frac{1}{co} \cdot (Y_1 - Y_2)$$

$$A = A + (T_{n+1}^T \times T_{n+1}) \text{ and}$$

$$P_{KK} = \sigma_z^2 \cdot A^{-1};$$

calculating an error covariance matrix $$P_{JJ} = \left(\frac{\partial K}{\partial J}\right)^{-1} \times P_{KK} \times \left(\frac{\partial K}{\partial J}\right)^{-1};$$

and computing error of the elements of b and D as elements of $J=[b_x b_y b_z pD_{11} pD_{22} pD_{33} pD_{12} pD_{13} pD_{23}]^T$ according to $\varepsilon_J=\text{sqrt}(\text{diag}(P_{JJ}))$, wherein $$pD = I_{3\times 3} + D = \begin{bmatrix} pD_{11} & pD_{12} & pD_{13} \\ pD_{12} & pD_{22} & pD_{23} \\ pD_{13} & pD_{23} & pD_{33} \end{bmatrix}.$$

18. The computer readable medium of claim 13 wherein the method further comprises:
  determining if the 3-D magnetometer measured values meet a predetermined criterion; and
  using the 3-D magnetometer measured values in the updating of the matrices T and U only if they meet the predetermined criterion.

* * * * *